United States Patent
Nakagawa

(10) Patent No.: US 11,283,442 B2
(45) Date of Patent: Mar. 22, 2022

(54) SEMICONDUCTOR DEVICE

(71) Applicant: FUJI ELECTRIC CO., LTD., Kawasaki (JP)

(72) Inventor: Sho Nakagawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/236,658

(22) Filed: Apr. 21, 2021

(65) Prior Publication Data

US 2021/0242869 A1     Aug. 5, 2021

Related U.S. Application Data

(63) Continuation of application No. PCT/JP2020/014974, filed on Apr. 1, 2020.

(30) Foreign Application Priority Data

May 17, 2019 (JP) .............................. JP2019-093306

(51) Int. Cl.
*H03K 3/00* (2006.01)
*H03K 17/06* (2006.01)
(Continued)

(52) U.S. Cl.
CPC ............ *H03K 17/687* (2013.01); *H02M 1/08* (2013.01); *H03K 19/20* (2013.01); *H03K 2217/0063* (2013.01); *H03K 2217/0081* (2013.01)

(58) Field of Classification Search
None
See application file for complete search history.

(56) References Cited

U.S. PATENT DOCUMENTS 9,374,006 B2 * 6/2016 Abdoulin ............... H02M 3/158
9,973,082 B1 * 5/2018 Nakagawa ........... H03K 17/063
(Continued)

FOREIGN PATENT DOCUMENTS

| JP | 2015-207866 A | 11/2015 |
| JP | 2018-078498 A | 5/2018 |
| WO | 2016/136114 A1 | 9/2016 |

OTHER PUBLICATIONS

International Search Report for PCT/JP2020/014974, dated Jun. 23, 2020.
(Continued)

*Primary Examiner* — Kenneth B Wells
(74) *Attorney, Agent, or Firm* — Rabin & Berdo, P.C.

(57) ABSTRACT

A semiconductor device, including a power supply terminal, an output terminal, a ground terminal, an N-channel main MOSFET connected between the power supply terminal and the output terminal, a drive circuit which operates to drive the main MOSFET, using a potential difference, between the power supply terminal and an internal ground, as a power supply thereof, an internal ground generation circuit which is provided between the power supply terminal and the ground terminal and which generates the internal ground, an N-channel first MOSFET provided between an output terminal of the internal ground generation circuit and the ground terminal, and a low voltage detection circuit which is provided between the power supply terminal and the ground terminal, and which turns on the first MOSFET upon detecting that a voltage between the power supply terminal and the ground terminal drops below a prescribed voltage.

7 Claims, 7 Drawing Sheets

(51) Int. Cl.
*H02M 3/07* (2006.01)
*H03K 17/687* (2006.01)
*H02M 1/08* (2006.01)
*H03K 19/20* (2006.01)

(56) References Cited

U.S. PATENT DOCUMENTS

2017/0005653 A1  1/2017  Ueta et al.
2017/0141682 A1  5/2017  Zhang
2018/0138811 A1  5/2018  Nakagawa

OTHER PUBLICATIONS

Morisawa et al., "High-Side 2-in-1 IPS 'F5114H' for Automobiles", Fuji Electric Review, vol. 62, No. 4, pp. 261-264, 2016.
Written Opinion for PCT/JP2020/014974, dated Jun. 23, 2020.

\* cited by examiner

SEMICONDUCTOR DEVICE

CROSS-REFERENCE TO RELATED APPLICATION

This application is a continuation application of International Application PCT/JP2020/014974 filed on Apr. 1, 2020 which designated the U.S., which claims priority to Japanese Patent Application No. 2019-093306, filed on May 17, 2019, the entire contents of which are incorporated herein by reference.

BACKGROUND OF THE INVENTION

1. Field of the Invention

The embodiments discussed herein relate to a semiconductor device.

2. Background of the Related Art

Many semiconductor devices that control switching of loads such as motors are installed in motor vehicles. As such an in-vehicle semiconductor device, a high-side intelligent power switch (IPS) is mainly used. The high-side IPS that integrates a power semiconductor switch for driving a load and a control circuit thereof on the same chip is disposed on the high-potential side of the load. In the high-side IPS, an N-channel metal-oxide-semiconductor field-effect transistor (MOSFET) is usually used as the power semiconductor switch. This is because an N-channel MOSFET exhibits lower on-resistance per unit area than a P-channel MOSFET. In addition, in the control circuit, a drive circuit that drives the N-channel MOSFET does not use a power supply (battery) voltage as it is, but uses the power supply voltage or an internal ground voltage that is locally generated, whichever is lower (see, for example, Japanese Laid-open Patent Publication No. 2018-78498 (paragraphs [0024] to [0030] and FIG. 4)). This is because a drive circuit configured to operate at a low voltage does not need to have a voltage-withstanding structure and thus leads to a reduction in chip area and thus in circuit scale.

FIG. 6 illustrates an example of a configuration of a conventional high-side IPS. FIG. 7 illustrates voltage changes in an internal ground voltage that occur with changes in the power supply voltage of the conventional high-side IPS. In the explanation of FIG. 6, the same reference numeral may be used to denote the same element. Such elements include terminals, voltages at the terminals, signals, and others.

The conventional high-side IPS 100 includes a main MOSFET 110, a drive circuit 120, and an internal ground generation circuit 130. The high-side IPS 100 also includes a power supply terminal 140, an output terminal 150, and a ground terminal 160. The power supply terminal 140 is connected to the positive terminal of a battery 170 that supplies a voltage VCC, and the negative terminal of the battery 170 is connected to the ground. The output terminal 150 is connected to one terminal of a load 180, and the other terminal of the load 180 is connected to the ground. The ground terminal 160 is connected to a chassis of a motor vehicle.

In this high-side IPS 100, the drain terminal of the main MOSFET 110 is connected to the power supply terminal 140, and the source terminal of the main MOSFET 110 is connected to the output terminal 150. The gate and source terminals of the main MOSFET 110 are connected to the drive circuit 120.

The internal ground generation circuit 130 includes P-channel MOSFETs 131 and 132, an N-channel MOSFET 133, a Zener diode 134, and a current source 135. The source terminal of the MOSFET 131 is connected to the power supply terminal 140, the gate terminal of the MOSFET 131 is connected to a terminal that receives a high-side input signal INH, and the drain terminal of the MOSFET 131 is connected to the source terminal of the MOSFET 132. The drain terminal of the MOSFET 132 is connected to the drain terminal of the MOSFET 133, the gate terminal of the MOSFET 133 is connected to a terminal that receives a low-side input signal INL, and the source terminal of the MOSFET 133 is connected to a ground terminal 160.

The cathode terminal of the Zener diode 134 is connected to the power supply terminal 140, and the anode terminal of the Zener diode 134 is connected to one terminal of the current source 135 and the gate terminal of the MOSFET 132. The other terminal of the current source 135 is connected to the ground terminal 160.

A connection node N between the drain terminal of the MOSFET 131 and the source terminal of the MOSFET 132 forms an internal ground and is connected to a low potential terminal of the drive circuit 120. The power supply terminal of the drive circuit 120 is connected to the power supply terminal 140 of the high-side IPS 100. Therefore, the drive circuit 120 operates at the potential difference between the voltage VCC of the power supply terminal 140 and the voltage of the internal ground provided by the internal ground generation circuit 130.

Assume now that, in the internal ground generation circuit 130, the Zener diode 134 has a breakdown voltage of 6.5 volts (V), the MOSFET 132 has a threshold voltage Vth of 1.5 V, and the voltage VCC is 13 V. In this case, a voltage of 6.5 V, which is obtained by subtracting the breakdown voltage Vz, 6.5 V, of the Zener diode 134 from the voltage VCC, 13 V, is applied to the gate terminal of the MOSFET 132. Therefore, the voltage at the source terminal (connection node N) of the MOSFET 132 operating as a source follower is 8 V that is obtained by adding the threshold voltage Vth, 1.5 V, to the voltage 6.5 V of the gate terminal. In this connection, this 8 V is a voltage with respect to the ground potential obtained when the voltage VCC does not change, and the voltage at the connection node N depends on the voltage VCC. In this connection, the voltage at the connection node N is a voltage with respect to the voltage VCC and is a fixed voltage that is lower than the voltage VCC by 5 V generated from the voltage VCC by the Zener diode 134 and MOSFET 132, and the potential difference of 5 V is used as a power supply voltage of the drive circuit 120.

When the high-side IPS 100 is in OFF operation where the load 180 is not driven, the high-side input signal INH is a voltage signal of (VCC−5) V and the low-side input signal INL is a voltage signal of 0 V that is the ground potential. Therefore, the P-channel MOSFET 131 is turned to ON state, and the N-channel MOSFET 133 is turned to OFF state. At this time, the internal ground at the connection node N is pulled up to the voltage VCC. Thus, the drive circuit 120 does not operate.

When the high-side IPS 100 that drives the load 180 is in ON operation, the high-side input signal INH is a voltage signal of voltage VCC, and the low-side input signal INL is a voltage signal of 5 V with respect to the ground potential. Therefore, the P-channel MOSFET 131 is turned to OFF state, and the N-channel MOSFET 133 is turned to ON state. At this time, the internal ground at the connection node N is (VCC−5) V, and the power supply voltage of the drive circuit 120 is 5 V. Therefore, the drive circuit 120 operates to apply a gate voltage higher than the voltage VCC to the gate terminal of the main MOSFET 110 to turn on the main MOSFET 110. Thus, a current is supplied from the battery 170 to the load 180 via the main MOSFET 110.

The following describes changes in the voltage of the internal ground when the voltage VCC of the battery 170 changes. When the high-side IPS 100 is in ON operation, the internal ground generation circuit 130 clamps the voltage VCC to the breakdown voltage of the Zener diode 134 and provides a fixed voltage obtained by adding the threshold voltage Vth of the MOSFET 132 as the voltage of the internal ground. Therefore, when the voltage VCC is sufficiently high, the voltage of the internal ground changes in proportion to the voltage VCC, as illustrated in FIG. 7.

When the voltage VCC drops below the breakdown voltage of the Zener diode 134 and the gate and drain terminals of the MOSFET 132 have values close to the ground potential, the voltage of the internal ground becomes the threshold voltage Vth of the MOSFET 132. At this time, the power supply voltage of the drive circuit 120 drops on or below 5 V, which means failing to keep the power supply voltage for the drive circuit 120 to operate properly.

However, for a semiconductor device such as a high-side IPS that uses a voltage that changes like a battery as a power supply voltage, it is desired that a drive circuit is able to operate with as low a voltage as possible in case the power supply voltage drops.

SUMMARY OF THE INVENTION

According to one aspect, there is provided semiconductor device that includes: a power supply terminal; an output terminal; a ground terminal; an N-channel main metal-oxide-semiconductor field-effect transistor (MOSFET) connected between the power supply terminal and the output terminal; a drive circuit which operates to drive the main MOSFET, using a potential difference, between the power supply terminal and an internal ground, as a power supply thereof; an internal ground generation circuit which is provided between the power supply terminal and the ground terminal, and which generates the internal ground; an N-channel first MOSFET provided between an output terminal of the internal ground generation circuit and the ground terminal; and a low voltage detection circuit which is provided between the power supply terminal and the ground terminal, and which turns on the N-channel first MOSFET upon detecting that a voltage between the power supply terminal and the ground terminal drops below a prescribed voltage.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
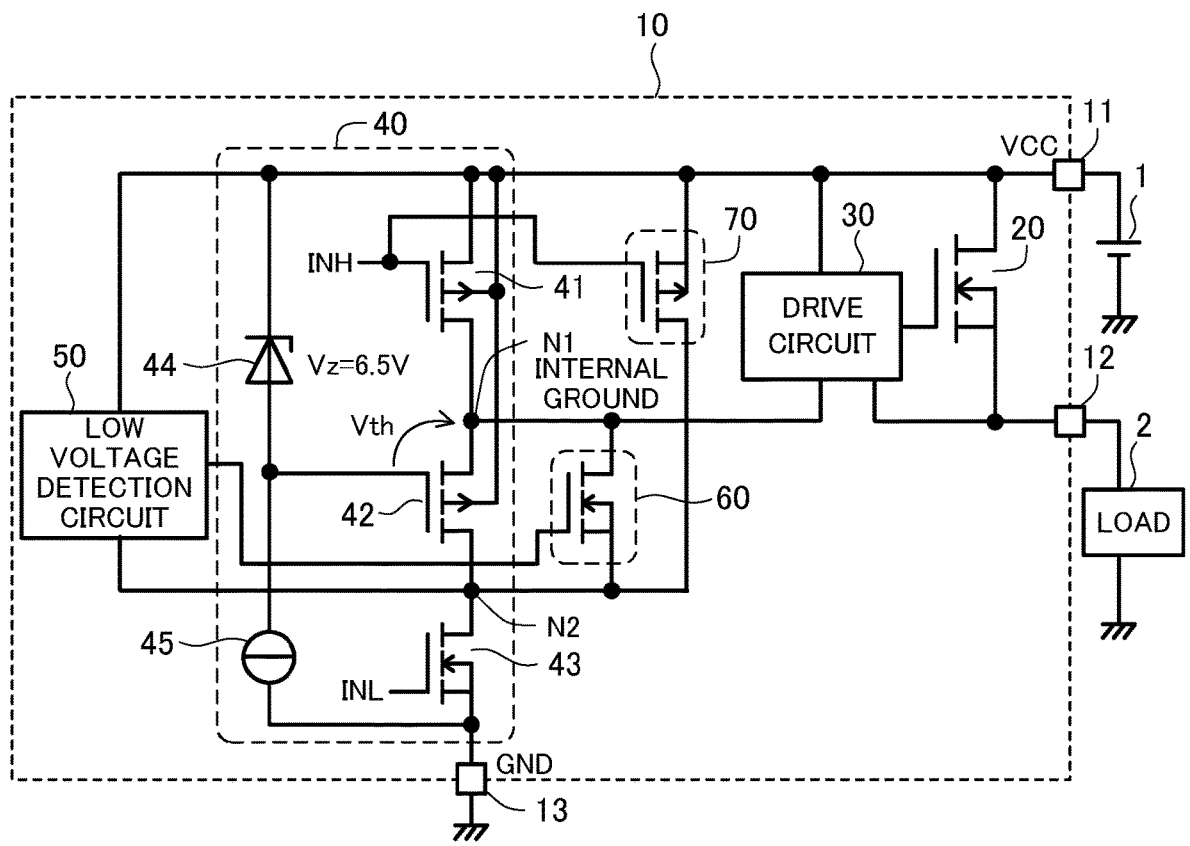
FIG. 1 illustrates an example of a configuration of a high-side IPS according to a first embodiment.

Hereinafter, some embodiments will be described in detail with reference to the accompanying drawings, using examples where semiconductor devices of the embodiments are applied to high-side IPSs that control switching of a variety of loads installed in mobile vehicles. In the following description, the same reference numeral may be used to denote the same element. Such elements include terminals, voltages at the terminals, signals, and others.

Figure 2:
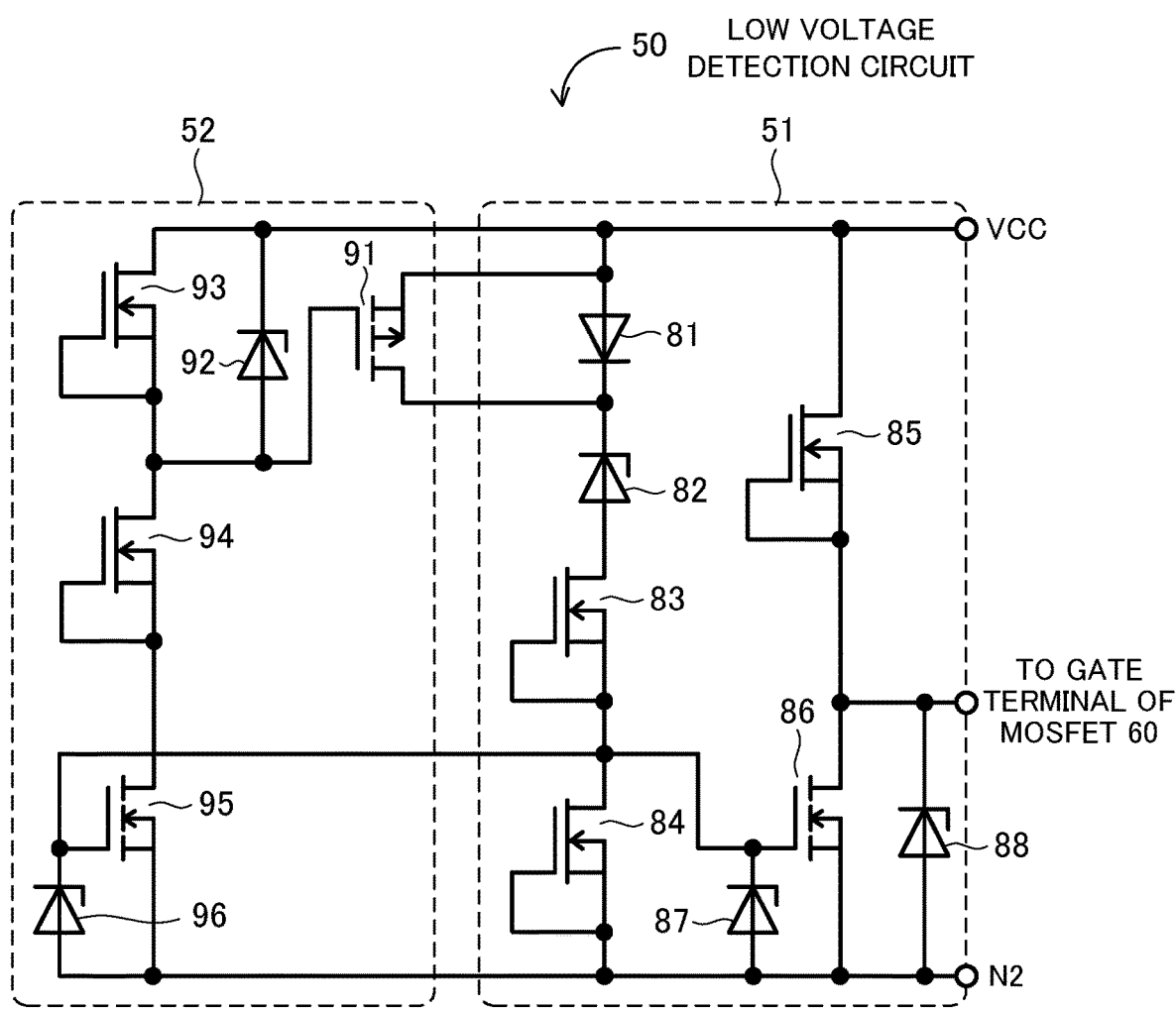
FIG. 2 is a circuit diagram illustrating an example of a configuration of a low voltage detection circuit.
Figure 3:
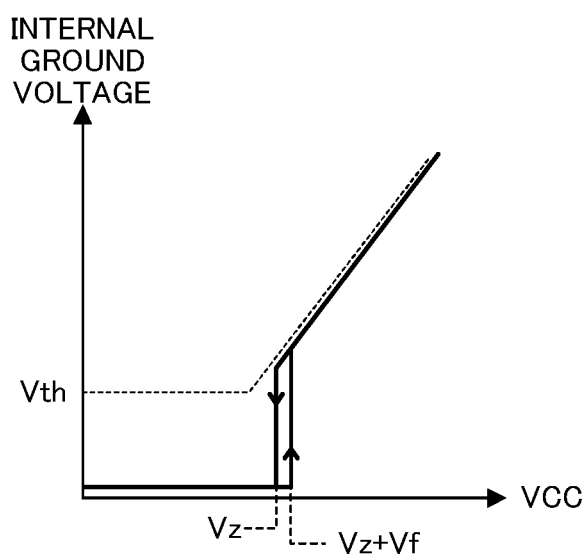
FIG. 3 illustrates voltage changes in an internal ground voltage that occur with changes in the power supply voltage of the high-side IPS.

FIG. 1 illustrates an example of a configuration of a high-side IPS according to a first embodiment. FIG. 2 is a circuit diagram illustrating an example of a configuration of a low voltage detection circuit. FIG. 3 illustrates voltage changes in an internal ground voltage that occur with changes in the power supply voltage of the high-side IPS.

The high-side IPS 10 illustrated in FIG. 1 includes a power supply terminal 11 that is connected to the positive terminal of a battery 1 and is supplied with a voltage VCC, an output terminal 12 connected to one terminal of a load 2, and a ground terminal 13 connected to the ground. The negative terminal of the battery 1 and the other terminal of the load 2 are connected to a chassis of a mobile vehicle.

The high-side IPS 10 includes an N-channel main MOSFET 20, a drive circuit 30, an internal ground generation circuit 40, a low voltage detection circuit 50, an N-channel MOSFET 60 (i.e., the "fourth MOSFET"), and a P-channel MOSFET 70 (i.e., the "eighth MOSFET").

In this high-side IPS 10, the drain terminal of the main MOSFET 20 is connected to the power supply terminal 11, and the source terminal of the main MOSFET is connected to the output terminal 12. The gate and source terminals of the main MOSFET 20 are connected to the drive circuit 30.

The internal ground generation circuit 40 includes P-channel MOSFETs 41 (i.e., the "first MOSFET") and 42 (i.e., the "second MOSFET"), an N-channel MOSFET 43 (i.e., the "third MOSFET"), a Zener diode 44, and a current source 45. The source terminal of the MOSFET 41 is connected to the power supply terminal 11, and the gate terminal of the MOSFET 41 is connected to a terminal that receives a high-side input signal INH. The drain terminal of the MOSFET 41 is connected to the source terminal of the MOSFET 42. The drain terminal of the MOSFET 42 is connected to the drain terminal of the MOSFET 43, and the gate terminal of the MOSFET 43 is connected to a terminal that receives a low-side input signal. The source terminal of the MOSFET 43 is connected to the ground terminal 13. In this connection, only the MOSFET 42 has a back-gate terminal not connected to its own source terminal but connected to the power supply terminal 11.

The cathode terminal of the Zener diode 44 is connected to the power supply terminal 11, the anode terminal of the Zener diode 44 is connected to one terminal of the current source 45 and the gate terminal of the MOSFET 42. The other terminal of the current source 45 is connected to the ground terminal 13.

The connection node N1 between the drain terminal of the MOSFET 41 and the source terminal of the MOSFET 42 forms an internal ground and serves as the output terminal of the internal ground generation circuit 40. The output terminal of the internal ground generation circuit 40 is connected to a low potential terminal of the drive circuit 30. The power supply terminal of the drive circuit 30 is connected to the power supply terminal 11 of the high-side IPS 10. Therefore, the drive circuit 30 operates using, as a power supply, the potential difference between the voltage VCC of the power supply terminal 11 and the voltage of the internal ground provided by the internal ground generation circuit 40.

The connection node N2 between the drain terminal of the MOSFET 42 and the drain terminal of the MOSFET 43 is connected to a low potential terminal of the low voltage detection circuit 50. The power supply terminal of the low voltage detection circuit 50 is connected to the power supply terminal 11 of the high-side IPS 10. Therefore, the low voltage detection circuit 50 operates using, as a power supply, the potential difference between the voltage VCC of the power supply terminal 11 and the voltage of the connection node N2.

The drain terminal of the N-channel MOSFET 60, which is a high potential terminal, is connected to the internal ground at the connection node N1, the gate terminal of the MOSFET 60 is connected to the output terminal of the low voltage detection circuit 50, and the source terminal of the MOSFET 60, which is a low potential terminal, is connected to the connection node N2. Therefore, this MOSFET 60 is turned on when the low voltage detection circuit 50 detects a drop in the voltage VCC of the power supply terminal 11 while the high-side IPS 10 is in ON operation. At this time, since the MOSFET 43 is ON, the voltage of the internal ground is caused to drop and become approximately equal to the ground potential (≈0 V) of the ground terminal 13. That is, the MOSFET 60 forms a voltage-drop enhancement circuit that sets, when the voltage VCC is low, the voltage of the internal ground to become equal to the potential of the ground terminal 13, so as to enable the high-side IPS 10 to operate with the low voltage VCC.

The source terminal of the P-channel MOSFET 70 is connected to the power supply terminal 11 of the high-side IPS 10, and the gate terminal of the MOSFET 70 is connected to the gate terminal of the MOSFET 41, and the drain terminal of the MOSFET 70 is connected to the connection node N2. Therefore, when the high-side IPS 10 is in OFF operation, the MOSFET 70 pulls the potential of the connection node N2 up to the voltage VCC and deactivates the operation of the low voltage detection circuit 50 so as to definitely prevent the malfunction of the low voltage detection circuit 50.

The low voltage detection circuit 50 includes a low voltage detection unit 51 and a hysteresis generation unit 52, as illustrated in FIG. 2. The low voltage detection unit 51 includes a diode 81, a Zener diode 82 (i.e., the "low voltage detection Zener diode"), N-channel depletion MOSFETs 83, 84, and 85, an N-channel MOSFET 86 (i.e., the "N-channel second MOSFET" or the "fifth MOSFET"), and Zener diodes 87 and 88.

For use of the forward voltage of the diode in generation of the hysteresis, the anode terminal of the diode 81 is connected to the terminal of voltage VCC and the cathode terminal of the diode 81 is connected to the cathode terminal of the Zener diode 82. The Zener diode 82 is used to generate a reference voltage for detecting a drop in the voltage VCC, and the anode terminal of the Zener diode 82 is connected to the drain terminal of the depletion MOSFET 83.

The gate terminal of the depletion MOSFET 83 is connected to the source terminal thereof to form a constant current diode (i.e., the "first constant current diode"), and the source terminal is connected to the drain terminal of the depletion MOSFET 84. The gate terminal of the depletion MOSFET 84 is connected to the source terminal thereof to form a constant current diode (i.e., the "second constant current diode"), and the source terminal is connected to the connection node N2.

The gate terminal of the depletion MOSFET 85 is connected to the source terminal thereof to form a constant current diode (i.e., the "third constant current diode"). The drain terminal of the depletion MOSFET 85 is connected to the terminal of voltage VCC, and the source terminal of the depletion MOSFET 85 is connected to the gate terminal of the voltage-drop enhancement MOSFET 60 and the drain terminal of the MOSFET 86. The gate terminal of the MOSFET 86 is connected to the connection point between the depletion MOSFETs 83 and 84, and the source terminal of the MOSFET 86 is connected to the connection node N2. The Zener diode 87 is to prevent the voltage between the gate and source of the MOSFET 86 from becoming excessive. To this end, the cathode terminal of the Zener diode 87 is connected to the gate terminal of the MOSFET 86, and the anode terminal of the Zener diode 87 is connected to the source terminal of the MOSFET 86. The Zener diode 88 is to prevent the voltage between the gate and source of the voltage-drop enhancement MOSFET 60 from becoming excessive. To this end, the cathode terminal of the Zener diode 88 is connected to the gate terminal of the voltage-drop enhancement MOSFET 60, and the anode terminal of the Zener diode 88 is connected to the connection node N2.

The hysteresis generation unit 52 includes a P-channel MOSFET 91 (i.e., the "sixth MOSFET"), a Zener diode 92, N-channel depletion MOSFETs 93 and 94, an N-channel MOSFET 95 (i.e., the "seventh MOSFET"), and a Zener diode 96.

When the high-side IPS 10 is in ON operation and the voltage VCC of the power supply terminal 11 does not drop, the MOSFET 91 makes a short-circuit between both terminals of the diode 81 in the low voltage detection unit 51 to deactivate the operation of the diode 81. The source terminal of the MOSFET 91 is connected to the anode terminal of the diode 81, and the drain terminal of the MOSFET 91 is connected to the cathode terminal of the diode 81. The gate terminal of the MOSFET 91 is connected to the anode terminal of the Zener diode 92, and the cathode terminal of the Zener diode 92 is connected to the terminal of voltage VCC. This Zener diode 92 is to prevent the voltage between the gate and source of the MOSFET 91 from becoming excessive.

The gate terminal of the depletion MOSFET 93 is connected to the source terminal thereof to form a constant current diode (i.e., the "fourth constant current diode"). The drain terminal of the depletion MOSFET 93 is connected to the terminal of voltage VCC, and the source terminal of the depletion MOSFET 93 is connected to the gate terminal of the MOSFET 91 and the drain terminal of the depletion MOSFET 94.

The gate terminal of the depletion MOSFET 94 is connected to the source terminal thereof to form a constant current diode (i.e., the "fifth constant current diode"). The source terminal of the depletion MOSFET 94 is connected to the drain terminal of the MOSFET 95.

The source terminal of the MOSFET 95 is connected to the connection node N2, and the gate terminal of the MOSFET 95 is connected to the gate terminal of the MOSFET 86 in the low voltage detection unit 51 and the cathode terminal of the Zener diode 96. The anode terminal of the Zener diode 96 is connected to the connection node N2. This Zener diode 96 is to prevent the voltage between the gate and source of the MOSFET 95 from becoming excessive.

The following describes how the low voltage detection circuit 50 operates when the battery 1 has a voltage VCC of 13 V, for example. In the case where the high-side IPS 10 is in OFF operation, a (VCC−5) V voltage signal is input to the gate terminal of the MOSFET 41 in the internal ground generation circuit 40 and the gate terminal of the MOSFET 70. Thereby, the MOSFET 70 is tuned on and pulls the potential of the connection node N1 up to the voltage VCC. Since a short circuit is formed between the terminal of voltage VCC and the terminal of the connection node N2, the operation of the low voltage detection circuit 50 is deactivated.

In the case where the high-side IPS 10 is in ON operation, the MOSFET 70 is turned off and the MOSFET 43 is turned on, so that the potential of the connection node N2 becomes approximately equal to the ground voltage (≈0 V). Therefore, the voltage VCC is applied as a power supply voltage to the low voltage detection circuit 50. At this time, the voltage VCC exceeds the breakdown voltage of the Zener diode 82, so that the Zener diode 82 goes into breakdown. The depletion MOSFETs 83 and 84 connected in series with the Zener diode 82 are always ON, the current in the Zener diode 82 flows through the depletion MOSFETs 83 and 84. The current flowing in the depletion MOSFET 83 is also supplied to the gate terminal of the MOSFET 86, so that the MOSFET 86 is turned on and the voltage at the gate terminal of the voltage-drop enhancement MOSFET 60 becomes approximately equal to the ground voltage (≈0 V). Thereby, the voltage-drop enhancement MOSFET 60 is turned off, so that the high-side IPS 10 operates as in a conventional one.

In this connection, in the case where the high-side IPS 10 is in ON operation, the hysteresis generation unit 52 deactivates the operation of the diode 81 of the low voltage detection unit 51 in the low voltage detection circuit 50. That is, the current flowing through the depletion MOSFET 83 that activates the MOSFET 86 is also supplied to the gate terminal of the MOSFET 95, so that the MOSFET 95 is ON. Since the depletion MOSFETs 93 and 94 connected in series with the MOSFET 95 are always ON, a high-level signal with respect to the voltage VCC is applied to the gate terminal of the MOSFET 91, so that the MOSFET 91 is ON. Thereby, the diode 81 connected in parallel to the MOSFET 91 is deactivated, and the voltage VCC is applied to the cathode terminal of the Zener diode 82 via the MOSFET 91.

The following describes how the high-side IPS 10 operates when the voltage VCC of the battery 1 drops. When the voltage VCC of the battery 1 is normal and the high-side IPS 10 is in ON operation, the Zener diode 82 in the low voltage detection circuit 50 is in breakdown.

When the voltage VCC of the battery 1 drops, the voltage of the internal ground drops accordingly, as illustrated in FIG. 3. When the voltage VCC of the battery 1 drops below the breakdown voltage Vz of the Zener diode 82, the current does not flow into the Zener diode 82, the MOSFET 86 is turned off, and the current flowing through the MOSFET 85 is supplied to the gate terminal of the voltage-drop enhancement MOSFET 60. Thereby, the voltage-drop enhancement MOSFET 60 is turned on, and the voltage of the internal ground is caused to drop and become approximately equal to the ground voltage (≈0 V). Since the internal ground is cut off from the internal ground generation circuit 40, the internal ground is not affected by the threshold voltage Vth of the MOSFET 42 operating as a source follower. Therefore, even when the voltage VCC drops, the range of the power supply voltage with which the drive circuit 30 is able to operate is extended by the threshold voltage Vth of the MOSFET 42, so that the drive circuit 30 is able to operate the high-side IPS 10 with the low voltage VCC.

When the MOSFET 86 is OFF, the MOSFET 95 in the hysteresis generation unit 52 is OFF. Therefore, the current does not flow into the depletion MOSFET 94 connected in series with the MOSFET 95. Therefore, the MOSFET 91 is turned off, and the diode 81 is activated. Thereby, the diode 81 is in a state connected to the Zener diode 82, and the Zener diode 82 goes into breakdown next time when the voltage VCC reaches the voltage obtained by adding the forward voltage Vf of the diode 81 to the breakdown voltage Vz of the Zener diode 82.

As described above, the low voltage detection circuit 50 has the following hysteresis characteristics: when the voltage VCC drops on or below the breakdown voltage Vz, the internal ground is set to the ground potential, and when the voltage VCC rises above the voltage (Vz+Vf), the internal ground is returned back to the original voltage.

Figure 4:
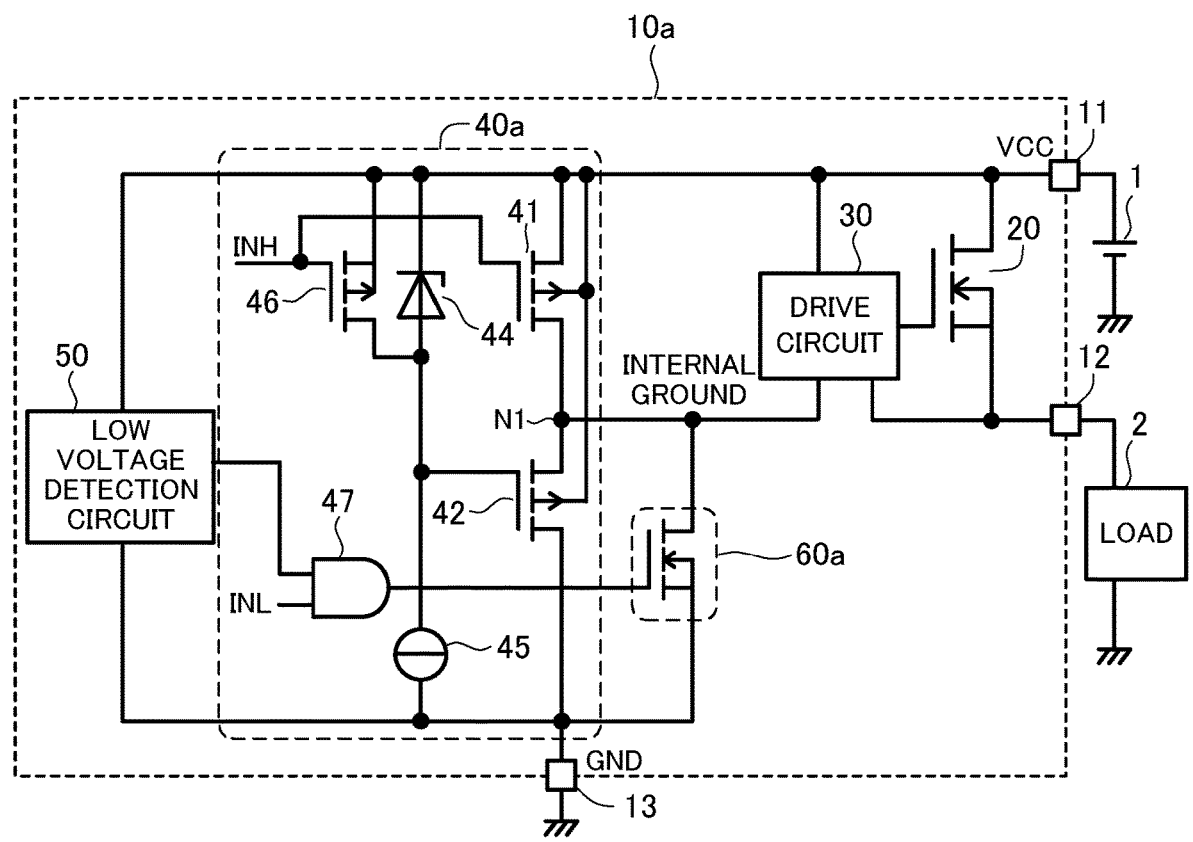
FIG. 4 illustrates an example of a configuration of a high-side IPS according to a second embodiment.

FIG. 4 illustrates an example of a configuration of a high-side IPS according to the second embodiment. Referring to FIG. 4, the same reference numerals as the constitutional elements of FIG. 1 are given to the corresponding constitutional elements of FIG. 4, and their detailed description will be omitted. In this connection, as in FIG. 2, a low voltage detection circuit 50 includes a low voltage detection unit 51 and a hysteresis generation unit 52, but in the second embodiment, a Zener diode 88 is not needed and the low-potential terminal is connected to a ground terminal 13.

The high-side IPS 10a of the second embodiment includes an internal ground generation circuit 40a, although the high-side IPS 10 of the first embodiment includes the internal ground generation circuit 40. That is, the internal ground generation circuit 40a includes P-channel MOSFETs 41 and 42, a Zener diode 44, a current source 45, a P-channel MOSFET 46, and an AND circuit 47.

The source terminal of the MOSFET 46 is connected to the power supply terminal 11, and the gate terminal of the MOSFET 46 is connected to a terminal that receives a high-side input signal INH, and the drain terminal of the MOSFET 46 is connected to the anode terminal of the Zener diode 44.

One input terminal of the AND circuit 47 is connected to the output terminal of the low voltage detection circuit 50, and the other input terminal of the AND circuit 47 is connected to a terminal that receives a low-side input signal INL. The output terminal of the AND circuit 47 is connected to the gate terminal of an N-channel MOSFET 60a (which is an example of the "N-channel first MOSFET") that forms a voltage-drop enhancement circuit. The drain terminal of the MOSFET 60a is connected to the internal ground at a connection node N1, and the source terminal of the MOSFET 60a is connected to the ground terminal 13.

With the above-described high-side IPS 10a, to cause the load 2 to be in OFF operation, the high-side input signal INH is a voltage signal of (VCC−5) V, and the low-side input signal INL is a voltage signal of 0 V that is the ground potential. Therefore, the MOSFETs 41 and 46 are turned to ON state and the MOSFETs 42 and 60a are turned to OFF state. At this time, the internal ground at the connection node N1 is pulled up to the voltage VCC, so the drive circuit 30 does not operate.

To cause the load 2 to be in ON operation, the high-side input signal INH is a voltage signal of voltage VCC, and the low-side input signal INL is a 5 V voltage signal with respect to the ground potential. In addition, when the voltage of the battery 1 does not drop, the low voltage detection circuit 50 provides the ground potential. Therefore, the MOSFETs 41 and 46 are turned to OFF state, and the MOSFET 42 is caused to operate as a source follower. At this time, the internal ground at the connection node N1 has a voltage of (VCC−5) V, and a 5 V power supply voltage is applied to the drive circuit 30, which turns on the main MOSFET 20.

Then, when the low voltage detection circuit 50 detects a drop in the voltage VCC of the battery 1 while the low-side input signal INL is a 5 V voltage signal with respect to the ground potential for causing the load 2 to be in ON operation, the low voltage detection circuit 50 provides the voltage VCC. At this time, the AND circuit 47 receives a high-level voltage signal at one input terminal and at the other input terminal and outputs a high-level voltage signal to turn the voltage-drop enhancement MOSFET 60a to ON state. Thereby, the internal ground is connected to the ground terminal 13, so that the potential of the internal ground, which does not drop below the threshold voltage Vth of the MOSFET 42 operating as a source follower, is caused to drop to the ground level.

Figure 5:
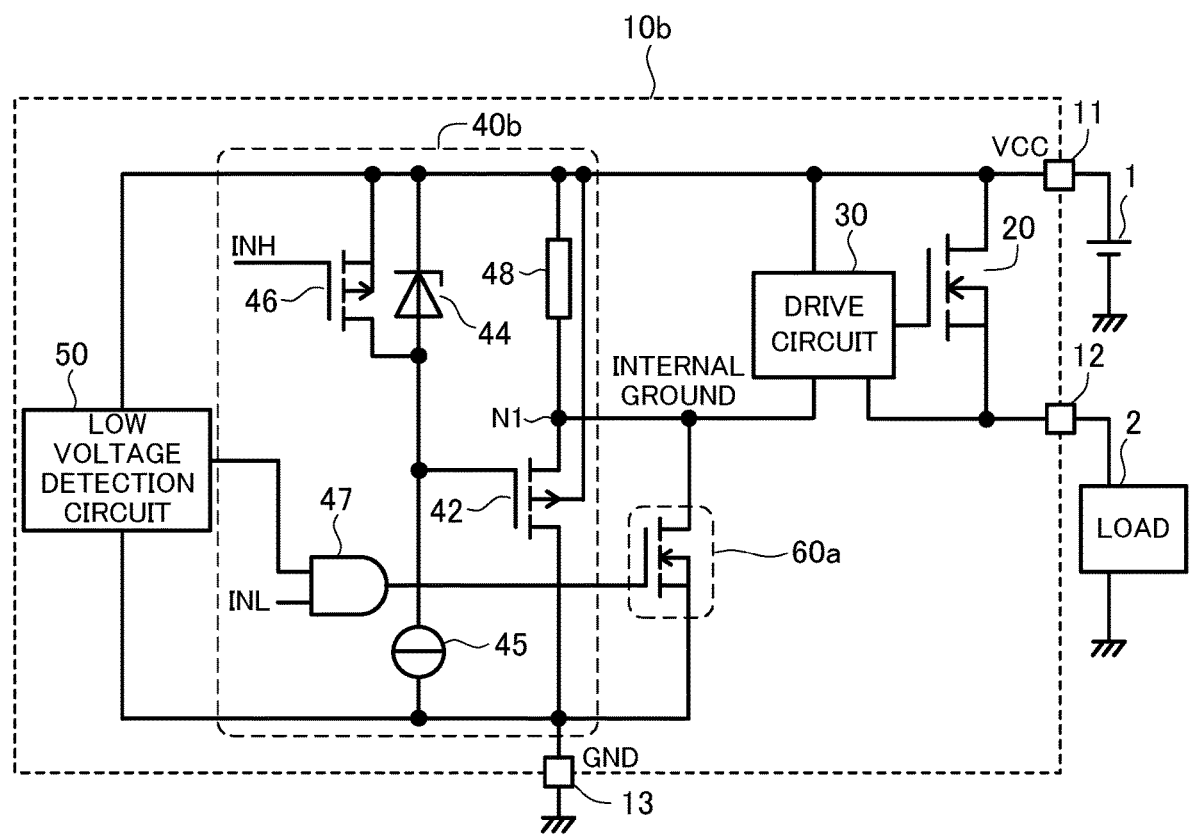
FIG. 5 illustrates an example of a configuration of a high-side IPS according to a third embodiment.
Figure 6:
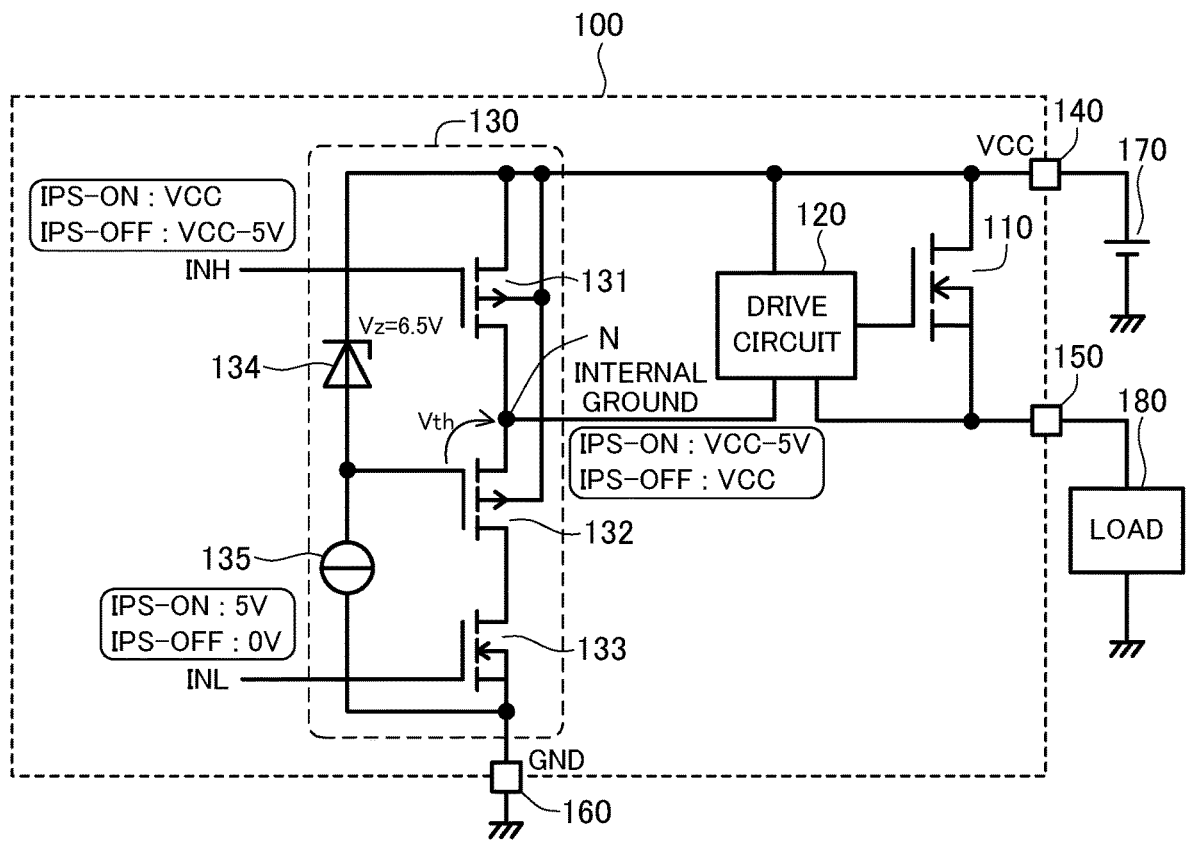
FIG. 6 illustrates an example of a configuration of a conventional high-side IPS.
Figure 7:
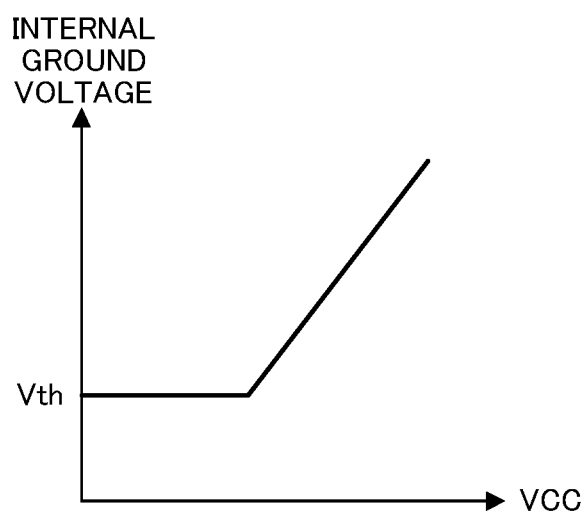
FIG. 7 illustrates voltage changes in an internal ground voltage that occur with changes in the power supply voltage of the conventional high-side IPS.

FIG. 5 illustrates an example of a configuration of a high-side IPS according to a third embodiment. The same reference numerals as the constitutional elements of FIG. 4 are given to the corresponding constitutional elements of FIG. 5, and their detailed description will be omitted.

The high-side IPS 10b of the third embodiment includes an internal ground generation circuit 40b, although the high-side IPS 10a of the second embodiment includes the internal ground generation circuit 40a. This internal ground generation circuit 40b includes a resistor 48 as the load of a MOSFET 42 operating as a source follower. That is, one terminal of the resistor 48 is connected to a power supply terminal 11, and the other terminal of the resistor 48 is connected to the source terminal of the MOSFET 42 and an internal ground.

With this high-side IPS 10b, to cause a load 2 to be in ON operation, a high-side input signal INH is a voltage signal of voltage VCC, and a low-side input signal INL is a 5 V voltage signal with respect to the ground potential. In addition, when the voltage of a battery 1 does not drop, a low voltage detection circuit 50 provides the ground potential. Therefore, a MOSFET 46 is turned to OFF state, and the MOSFET 42 operates as a source follower. At this time, the internal ground at a connection node N1 has a voltage of (VCC−5) V, and a voltage of 5 V that is a potential difference between VCC and (VCC−5) V is applied as a power supply voltage to a drive circuit 30, so as to turn on a main MOSFET 20.

When the low voltage detection circuit 50 detects a drop in the voltage VCC of the battery 1 while the 5 V low-side input signal INL with respect to the ground potential is input to cause the load 2 to be in ON operation, the low voltage detection circuit 50 provides the voltage VCC. At this time, a voltage-drop enhancement MOSFET 60a is turned to ON state, and the internal ground is connected to a ground terminal 13, so that the potential of the internal ground drops down to the ground level.

In this connection, in the third embodiment, the load of the MOSFET 42 operating as a source follower is formed by the resistor 48. Alternatively, the MOSFET 41 of the internal ground generation circuit 40 of the first embodiment is replaced with a resistor. In addition, in the above embodiments, a power MOSFET is used as an element that supplies a power supply to the load. However, the power MOSFET may be replaced with an insulated gate bipolar transistor (IGBT). In this case, the operation using the IGBT is the same as that using the power MOSFET.

The semiconductor device configured as above has the following advantage in that the range of the power supply voltage with which the drive circuit is able to operate is lowered by the first MOSFET enhancing the voltage-drop of an internal ground upon detection of a drop in the voltage of the power supply terminal.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a power supply terminal;
   an output terminal;
   a ground terminal;
   an N-channel main metal-oxide-semiconductor field-effect transistor (MOSFET) connected between the power supply terminal and the output terminal;
   a drive circuit which operates to drive the main MOSFET, using a potential difference, between the power supply terminal and an internal ground, as a power supply thereof;
   an internal ground generation circuit which is provided between the power supply terminal and the ground terminal, and which generates the internal ground;
   an N-channel first MOSFET provided between an output terminal of the internal ground generation circuit and the ground terminal; and
   a low voltage detection circuit which is provided between the power supply terminal and the ground terminal, and which turns on the N-channel first MOSFET upon detecting that a voltage between the power supply terminal and the ground terminal drops below a prescribed voltage.

2. The semiconductor device according to claim 1, wherein the low voltage detection circuit includes
   a low voltage detection Zener diode which is connected to the power supply terminal and through which a current stops flowing in response to a drop in the voltage between the power supply terminal and the ground terminal below a breakdown voltage,
   a first constant current diode and a second constant current diode, each of which is formed of a depletion MOSFET, connected in series between the low voltage detection Zener diode and the ground terminal,
   a third constant current diode, which is formed of a depletion MOSFET, connected between the power supply terminal and an output terminal of the low voltage detection circuit, and an N-channel second MOSFET which is connected between the output terminal of the low voltage detection circuit and the ground terminal, and which is turned off in response to a drop in a potential at a connection point between the first constant current diode and the second constant current diode while the low voltage detection Zener diode is not in breakdown.

3. The semiconductor device according to claim 1, further comprising an AND circuit which turns on the N-channel first MOSFET only while the low voltage detection circuit detects that the voltage between the power supply terminal and the ground terminal drops below the prescribed voltage and the AND circuit receives an input for turning on the N-channel main MOSFET.

4. A semiconductor device, comprising:
a power supply terminal;
an output terminal;
a ground terminal;
a main metal-oxide-semiconductor field-effect transistor (MOSFET) connected between the power supply terminal and the output terminal;
a drive circuit which operates to drive the main MOSFET, using a potential difference, between the power supply terminal and an internal ground, as a power supply thereof;
an internal ground generation circuit which includes
 a first MOSFET which is connected to the power supply terminal and is turned off in response to the main MOSFET being turned on,
 a second MOSFET which is connected in series with the first MOSFET, the second MOSFET and the first MOSFET having a first connection node therebetween as the internal ground,
 a third MOSFET which is connected between the second MOSFET and the ground terminal and which is turned on in response to the main MOSFET being turned on,
 a Zener diode which is connected between the power supply terminal and a gate terminal of the second MOSFET, and which outputs a reference voltage for generating the potential difference, and
 a current source connected between the gate terminal of the second MOSFET and the ground terminal;
a fourth MOSFET connected between a second connection node, to which the second MOSFET and the third MOSFET are connected, and the first connection node; and
a low voltage detection circuit which is connected between the power supply terminal and the second connection node, and which turns on the fourth MOSFET upon detecting that a voltage between the power supply terminal and the second connection node drops below a prescribed voltage, wherein
each of the first and second MOSFETs is a P-channel MOSFET, and
each of the main MOSFET, the third MOSFET and the fourth MOSFET is an N-channel MOSFET.

5. The semiconductor device according to claim 4, wherein the low voltage detection circuit includes
 a low voltage detection Zener diode which is connected to the power supply terminal and through which a current stops flowing in response to a drop in the voltage between the power supply terminal and the second connection node below a breakdown voltage,
 a first constant current diode and a second constant current diode, each of which is formed of a depletion MOSFET, connected in series between the low voltage detection Zener diode and the second connection node,
 a third constant current diode, which is formed of a depletion MOSFET, connected between the power supply terminal and a gate terminal of the fourth MOSFET, and
 a fifth MOSFET which
  is an N-channel MOSFET,
  is connected between the gate terminal of the fourth MOSFET and the second connection node, and
  is turned off to turn on the fourth MOSFET in response to a drop in a potential at a connection point between the first constant current diode and the second constant current diode while the low voltage detection Zener diode is not in breakdown.

6. The semiconductor device according to claim 5, wherein the low voltage detection circuit further includes:
 a diode connected in series with the low voltage detection Zener diode; and
 a hysteresis generation unit including:
  a sixth MOSFET connected in parallel to the diode,
  a seventh MOSFET which is turned on in response to the fifth MOSFET being turned on, and
  a fourth constant current diode and a fifth constant current diode, each of which is formed of a depletion MOSFET, connected in series between the power supply terminal and the seventh MOSFET and which turn on the sixth MOSFET by a potential at a connection point therebetween while the seventh MOSFET is ON, wherein
 the sixth and seventh MOSFETs are respectively a P-channel MOSFET and an N-channel MOSFET.

7. The semiconductor device according to claim 4, further comprises an eighth MOSFET which is a P-channel MOSFET and is connected between the power supply terminal and the second connection node, and which is turned on in response to the first MOSFET being turned on.

* * * * *